United States Patent
Nakayama et al.

(10) Patent No.: US 8,518,556 B2
(45) Date of Patent: Aug. 27, 2013

(54) ELECTROLUMINESCENT ELEMENT

(75) Inventors: Yoriko Nakayama, Tokyo (JP); Hiroshi Kashiwagi, Tokyo (JP); Hiroyuki Hashimoto, Saitama (JP); Kunimasa Hiyama, Tokyo (JP)

(73) Assignee: Konica Minolta Holdings, Inc., Tokyo (JP)

(*) Notice: Subject to any disclaimer, the term of this patent is extended or adjusted under 35 U.S.C. 154(b) by 548 days.

(21) Appl. No.: 12/161,540

(22) PCT Filed: Dec. 21, 2006

(86) PCT No.: PCT/JP2006/325496
§ 371 (c)(1),
(2), (4) Date: Jul. 18, 2008

(87) PCT Pub. No.: WO2007/086216
PCT Pub. Date: Aug. 2, 2007

(65) Prior Publication Data
US 2010/0221547 A1    Sep. 2, 2010

(30) Foreign Application Priority Data
Jan. 27, 2006   (JP) ................................. 2006-018759

(51) Int. Cl.
*H01L 51/54* (2006.01)
(52) U.S. Cl.
USPC ............ 428/690; 428/917; 313/504; 313/506
(58) Field of Classification Search
None
See application file for complete search history.

(56) References Cited

U.S. PATENT DOCUMENTS

| | | | |
|---|---|---|---|
| 6,097,147 A | 8/2000 | Baldo et al. | |
| 2001/0053462 A1* | 12/2001 | Mishima | 428/690 |
| 2002/0197511 A1* | 12/2002 | D'Andrade et al. | 428/690 |
| 2004/0104394 A1* | 6/2004 | Lin et al. | 257/79 |
| 2004/0124766 A1* | 7/2004 | Nakagawa et al. | 313/504 |
| 2004/0142208 A1* | 7/2004 | Hamada et al. | 428/690 |
| 2004/0150352 A1* | 8/2004 | Koide et al. | 315/169.3 |
| 2004/0258956 A1 | 12/2004 | Matsusue | |
| 2005/0037232 A1* | 2/2005 | Tyan et al. | 428/690 |
| 2005/0074630 A1* | 4/2005 | Kanno et al. | 428/690 |
| 2005/0164033 A1* | 7/2005 | Chin et al. | 428/690 |
| 2009/0085479 A1* | 4/2009 | Ushikubo | 313/506 |

FOREIGN PATENT DOCUMENTS

| | | |
|---|---|---|
| JP | 2001319780 | 11/2001 |
| JP | 2003068465 | 3/2003 |
| JP | 2004311420 | 11/2004 |
| JP | 2004319456 | 11/2004 |
| JP | 2005100957 | 4/2005 |
| JP | 2005101004 | 4/2005 |
| JP | 2005123205 | 5/2005 |
| JP | 2005255986 | 9/2005 |
| JP | 2005293882 | 10/2005 |
| JP | 2006207170 | 8/2006 |
| JP | 2007041759 | 2/2007 |

OTHER PUBLICATIONS

Finkenzeller et al., Chemical Physics Letters, vol. 377, Issues 3-4, Aug. 15, 2003, pp. 299-305.*
"Color." Web. Sep. 27, 2011. <http://hyperphysics.phy-astr.gsu.edu/Hbase/vision/specol>.*
M.A. Baldo, et al, Nature, vol. 395, pp. 151-154 (1998).
M.A. Baldo, et al, Nature, vol. 403, No. 17, pp. 750-753 (2000).

* cited by examiner

*Primary Examiner* — Dawn Garrett
(74) *Attorney, Agent, or Firm* — Lucas & Mercanti, LLP

(57) ABSTRACT

Provided is an organic electroluminescence element which is driven with a reduced drive voltage without deteriorating emission luminance and has a high power efficiency. The organic electroluminescence element having at least one light emitting layer is characterized in that two or more types of light emitting dopants having different emission colors are included in at least one light emitting layer, the concentration of all the light emitting dopants included in the light emitting layer is 5 Vol % or more, and the concentration of the light emitting dopant giving a main emission color among the light emitting dopants in the light emitting layer is 2 Vol % or less.

8 Claims, 1 Drawing Sheet

LIGHT

LIGHT

ELECTROLUMINESCENT ELEMENT

This is a U.S. National Phase Application under 35 U.S.C. 371 of International Application PCT/JP2006/325496, filed on Dec. 21, 2006.

This Application claims the priority of Japanese Application No. 2006-018759, filed Jan. 27, 2006, the entire content of which is hereby incorporated by reference.

TECHNICAL FIELD

The present invention relates to an electroluminescent element with high power efficiency and reduced operation voltage.

TECHNICAL BACKGROUND

Electroluminescent displays are used as light emitting type electronic display device (ELD). As the constituting element of the ELD, an inorganic electroluminescent element (inorganic EL element) and an organic electroluminescent element (organic EL element) are cited. The inorganic EL element has been used as a planar light source though high alternative voltage is required for driving such the light emitting device.

The organic EL element is an element having a light emission layer placed between a cathode and an anode, in which electrons and positive holes are injected into the light emission layer and excitons are generated by recombination of them, and light (fluorescence or phosphorescence) is emitted on the occasion of quenching of the excitons. Such the device is noted because which can emit light by application of a voltage of several to several tens volts, and has wide viewing angle and high visibility since it is a self light emission type, and is completely solid state thin device suitable for space saving and portable appliance.

It is important character of the organic EL element that the element is a planar light source different from ordinary practically used principal light sources such as light emission diodes and cold cathode ray tubes. As the use for effectively utilizing such the character, illuminating light source and backlight for various displays are cited. Particularly, such the element is suitably used for the backlight of liquid crystal full color display which is strongly demanded in recent years.

The element is used as a source of white light when the element is used as the backlight of the full color display. The following methods are applicable for obtaining white light by the organic EL element; a method in which plural light emission materials emitting two kinds of light in additive complementary colors are used in an element so as to emit white light by color mixing (Patent Document 1), a method in which plural materials emitting light of blue, green and red colors for obtaining white light. It is preferred a method employing plural materials emitting light of blue, green and red colors in view of color reproduction, reducing light loss by a color filter and so on.

It has been reported to obtain blue, green and red light that a white light emission organic EL element can be obtained by doping the fluorescent materials reach emits blue, green or red light with high efficiency as the light emission material; cf. Patent Document 2 for example.

moreover, development of phosphorescent light emission material is made progress since an element showing high luminance light emission can be obtained; cf. Non-Patent Documents 1 to 3 for example. Such the effect causes that the light emission efficiency of the phosphorescent light emission material can be raised for 4 times in maximum of that of the fluorescent light emission material because the upper limit of internal quantum efficiency becomes 100% by the later-mentioned formation ratio of the singlet to triplet exciton and the internal conversion from the singlet exciton to the triplet exciton compared with the case of the light emission in usual fluorescent material in which the light is generated from singlet excited state and the formation probability of the light emission exciton species is 25% since the formation ratio of the singlet exciton to triplet exciton is 1:3.

Patent Document 4 discloses that a white light element is obtained by incorporating emission dopants emitting light of blue, green, and red colors in a single emission layer. However, the amount of emission dopants incorporated in the emission layer is at most 3% by weight even when the 3 types thereof are combined. Accordingly, such a small amount results in insufficient luminance.

Further, there is a method of increasing the dopant content to realize further enhanced emission luminance. However, in this case, there have been noted problems such that the drive voltage is relatively high and the power efficiency is decreased.

Patent Document 5 discloses that enhanced luminance and high efficiency can be realized by simultaneously using a plurality of emission dopants emitting light of similar colors in a single emission layer. However, an emission spectrum produced by a combination of dopants featuring different spectrum shapes results in a disadvantage in color reproduction due to a broadened spectrum.

In Unexamined Japanese Patent Application Publication Nos. 2004-006165 and 2004-235168, there is cited an example in which with regard to an element, which realizes white emission color by employing the three colors of blue, green, and red, a light emitting material in an adjacent layer is doped as an auxiliary light emitting substance. However, a recombination region of electrons and positive holes shifts due to variation of the drive current, whereby the object is to color-compensate for a varied emission color, resulting in no contribution to improving power efficiency.

Patent Document 1: Unexamined Japanese Patent Application Publication (hereinafter also referred to as JP-A) No. H07-041759
Patent Document 2: JP-A No. H06-207170
Patent Document 3: U.S. Pat. No. 6,097,147
Patent Document 4: JP-A No. 2001-319780
Patent Document 5: JP-A No. 2003-068465
Non-Patent Document 1: M. A. Baldo et al., Nature, Vol. 395, pages 151-154 (1998)
Non-Patent Document 2: M. A. Baldo et al., Nature, Vol. 403, No. 17, pages 750-753 (2000)

DISCLOSURE OF THE INVENTION

Problems to be Solved by the Invention

An object of the present invention is to provide an organic electroluminescence element, exhibiting high power efficiency, which is driven at a reduced drive voltage with no decrease in emission luminance.

Means to Solve the Problems

The object of the present invention can be achieved employing the following methods.

1. An organic electroluminescence element comprising at least one emission layer, wherein the emission layer contains two or more emission dopants producing different emission colors; content of all of the emission dopants in the emission layer is 5% or more by volume based on a volume of the emission layer; and a content of the emission dopant emitting light of a main emission color among the emission dopants is not more than 2% by volume based on a volume of the emission layer.

2. The organic electroluminescence element, described in item 1, wherein, a peak wavelength of an emission spectrum of the emission dopant emitting light of a main emission color among the emission dopants is longer than that of other dopants, and HOMO level of an emission dopant having an emission spectrum of a shorter peak wavelength is higher than that of an emission dopant having an emission spectrum of a longer peak wavelength.

3. The organic electroluminescence element, described in item 1 or 2, wherein the peak wavelength difference between emission spectra of the emission dopants is more than 30 nm.

4. The organic electroluminescence element, described in any one of items 1-3, wherein in a white organic electroluminescence element comprising three emission layers each emitting a color of blue, green, and red, at least one of the green light emission layer and the red light emission layer contains two or more emission dopants producing different emission colors.

5. The organic electroluminescence element, described in any one of items 1-4, wherein at least one emission dopant emits phosphorescence among the emission dopants.

Effects of the Invention

According to the present invention, when at least two types of emission dopants producing different emission colors are incorporated in a single emission layer, the drive voltage can be reduced without decreasing current efficiency (quantum efficiency) and an organic electroluminescence element exhibiting high power efficiency can be provided even when the content of an emission dopant emitting light of a main emission color is as low as at most 2% by volume, based on the emission layer.

DESCRIPTION OF THE SYMBOLS

Figure 1:
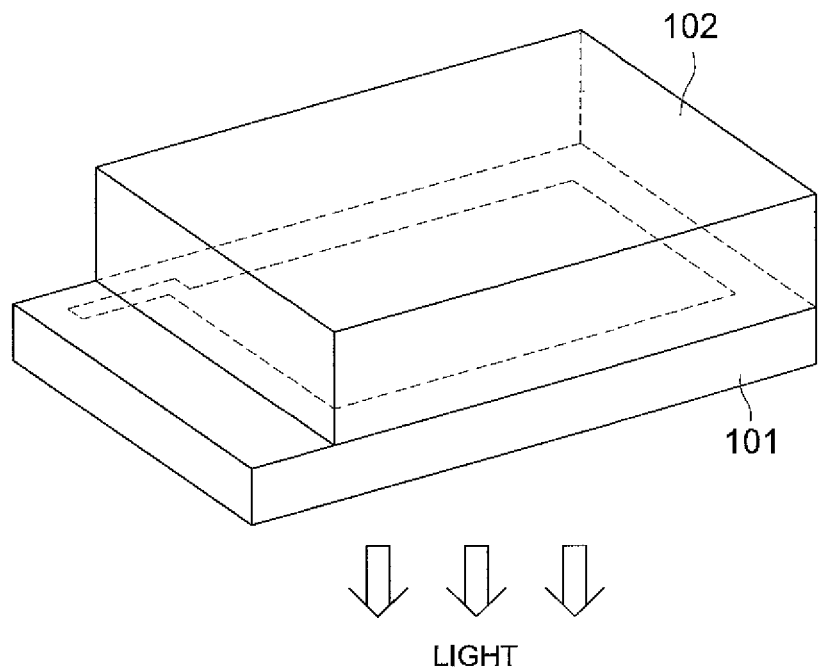
FIG. 1 shows a schematic drawing of the illuminating device of the invention.

| DESCRIPTION OF THE SYMBOLS | |
|---|---|
| 101: | Organic EL element |
| 102: | Glass cover |
| 105: | Cathode |
| 106: | Organic EL layer |
| 107: | Glass substrate having transparent electrode |
| 108: | Nitrogen gas |
| 109: | Moisture capturing agent |

BEST EMBODIMENT PRACTICING THE INVENTION

The best embodiment to practice this invention is described below.

An organic electroluminescent element having improved power efficiency can be provided by the invention described in claims 1 through 5.

Each element according to this invention is described in detail below in sequence:

<<Organic Electroluminescent Element>>

The organic electroluminescent element is composed of a light emission layer containing light emitting compound provided between an anode and a cathode, wherein an electron and positive hole are injected to the light emission layer, an exciton is generated by recombination and the element emits light by employing light emission (fluorescent/phosphorescent light) when this exciton loses activity.

Preferable concrete examples of the layer constitution of the organic EL element of the invention are listed below, though the invention is not limited to them.

(i) Anode/Light emission layer/Electron transport layer/Cathode (ii) Anode/Positive hole transport layer/Light emission layer/Electron transport layer/Cathode (iii) Anode/Positive hole transport layer/Light emission layer/Positive hole blocking layer/Electron transport layer/Cathode (iv) Anode/Positive hole transport layer/Light emission layer unit/Positive hole blocking layer/Electron transport layer/Cathode buffer layer/Cathode (v) Anode/Anode buffer layer/Positive hole transport layer/Light emission layer/Positive hole blocking layer/Electron transport layer/Cathode buffer layer/Cathode In the above, the light emission layer unit preferably has at least three light emission layer different from each other in the wavelength of emitting light and non-light emission layers between the each of layers.

<<Light Emission Layer>>

The light emission layer relating to the invention is a layer in which electrons and positive holes each injected from the electrodes or the electron transport layer and the positive hole transport layer, respectively, are recombined to emit light and the portion of light emission may be inside of the layer or the interface of the light emission layer and the adjacent layer.

The light emission layer relating to the invention preferably has at least three light emission layers, namely, the blue light emission layer, the green light emission layer and the red light emission layer each having the emission maximum within the blue region, green and red region, respectively even though the structure of the light emission layer of the invention is not specifically limited as long as the emission maximum wavelength of the emitted light is satisfies the above conditions.

When the number of the light emission layer is four or more, plural layers having the same light emission spectrum or the emission maximum wavelength as another layer may be contained.

In the invention, the layers each having the emission maximum wavelength of from 440 to 490 nm, 500 to 540 nm and 600 to 640 nm are referred to as blue light emission layer, green light emission layer and red light emission layer, respectively.

It is preferable that non-light emission intermediate layer is provided between each of the light emission layers.

The total thickness of the light emission layer is preferably within the range of from 1 to 100 nm and more preferably not more than 30 nm because lower driving voltage can be utilized. In the invention, the total thickness of the light emission layers is a thickness including the non-light emission intermediate layers when the intermediate layers are provided.

The thickness of individual light emission layer is preferably controlled within the range of from 1 to 50 nm and more preferably from 1 to 20 nm. The relation between the thickness of each of the blue, green and red light emission layers is not specifically limited.

The light emission layer can be prepared by forming a layer of the later-mentioned light emission dopant and the host compound by known method such as a vacuum deposition method, spin coating method, LB method and ink-jet method.

Plural light emission materials may be mixed in each of the layers and the phosphorescent light emission dopant and the fluorescent light emission dopant may be used in the same layer, in this invention.

It is preferable that the light emission layer is preferably constituted by containing the host compound and the light emission dopant (also referred as light emission dopant compound) so as to emit light from the light emission dopant in this invention.

As the host compound to be contained in the light emission layer of the organic EL element, a compound is preferable which has a phosphorescent quantum efficiency of the fluorescent light emission of less than 0.1 and more preferably less than 0.01 at room temperature (25° C.). The volume ratio of the host compound in the compounds contained in the light emission layer is preferably not less than 50%.

As the host compound, known host compounds may be used singly or in a combination of plural kinds thereof. The transfer of charge can be controlled by the combination use of the host compounds so as to raise the efficiency of the organic EL element. Moreover, mixing of different emitted light is made possible by the use of plural kinds of light emission material so as that optional color light can be obtained.

The light emission host compound used in this invention may be a known low molecular weight compound, a polymer compound having a repeating unit or a low molecular compound having a polymerizable group such as a vinyl group and an epoxy group (vapor deposition polymerizable light emission host).

As the known host compound, a compound is preferable which has positive hole transport ability and electron transport ability, an ability to prevent shift of emitted light to loner wavelength side and high glass transition point Tg. The glass transition point Tg is a value obtained by the method according to JIS-K-7121 using differential scanning colorimetry (DSC).

As known examples of an emission host, compounds described in the following Documents are preferable: For example, JP-A 2001-257076, JP-A 2002-308855, JP-A 2001-313179, JP-A 2002-319491, JP-A 2001-357977, JP-A 2002-334786, JP-A 2002-8860, JP-A 2002-334787, JP-A 2002-15871, JP-A 2002-334788, JP-A 2002-43056, JP-A 2002-334789, JP-A 2002-75645, JP-A 2002-338579, JP-A 2002-105445, JP-A 2002-343568, JP-A 2002-141173, JP-A 2002-352957, JP-A 2002-203683, JP-A 2002-363227, JP-A 2002-231453, JP-A 2003-3165, JP-A 2002-234888, JP-A 2003-27048, JP-A 2002-255934, JP-A 2002-260861, JP-A 2002-280183, JP-A 2002-299060, JP-A 2002-302516, JP-A 2002-305083, JP-A 2002-305084 and JP-A 2002-308837.

The emission dopant of this invention will now be described.

As an emission dopant used in this invention, a fluorescent compound or a phosphorescence emitting dopant (also referred to as a phosphorescent compound or a phosphorescence emitting compound) are employed.

The phosphorescence emitting material is a compound which emits light from the excited triplet, which is specifically a compound which emits phosphorescence at room temperature (25° C.), and is defined to exhibit a phosphorescent quantum yield at 25° C. of not less than 0.01, and the phosphorescent quantum yield at 25° C. is preferably not less than 0.1.

The phosphorescent quantum yield can be measured according to a method described in the fourth edition "Jikken Kagaku Koza (Experimental Chemistry Course) 7", Bunko (Spectroscopy) II, page 398 (1992) published by Maruzen. The phosphorescent quantum yield in a solution can be measured employing various kinds of solvents. The phosphorescence emitting material of the present invention is a compound, in which the phosphorescent quantum yield measured employing any one of the solvents falls within the above-described range (0.01 or more).

The light emission of the phosphorescence emitting material is divided in two types in principle, one is an energy transfer type in which recombination of a carrier occurs on the host to which the carrier is transported to excite the host, the resulting energy is transferred to the phosphorescent compound, and light is emitted from the phosphorescent compound, and the other is a carrier trap type in which recombination of a carrier occurs on the phosphorescent compound which is a carrier trap material, and light is emitted from the phosphorescent compound. Energy level of the phosphorescent compound in excited state is required to be lower than that of the host in excited state in each type.

The phosphorescence emitting material can be optionally selected from the known phosphorescence emitting materials used in the light emission layer of an organic EL element.

The phosphorescence emitting material is preferably a complex containing a metal of Group 8-10 of the periodic table, and more preferably an iridium compound, an osmium compound, a platinum compound (a platinum complex compound) or a rare-earth metal complex. The most preferable is an iridium compound of these.

Specific examples of a compound used as a phosphorescence emitting material are shown below, however, the present invention is not limited thereto. These compounds can be synthesized, for example, according to a method described in Inorg. Chem., 40, 1704-1711.

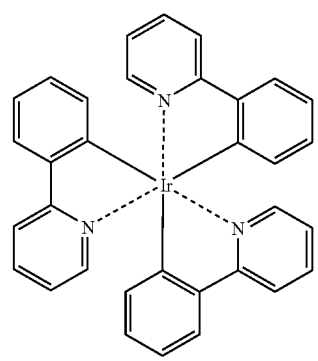

Ir-1

Ir-2 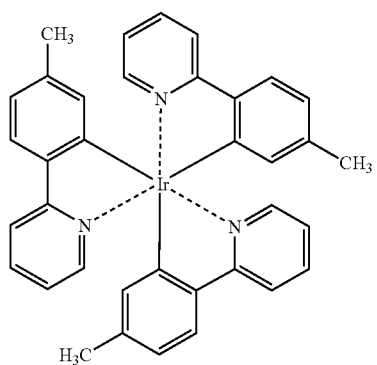
Ir-3 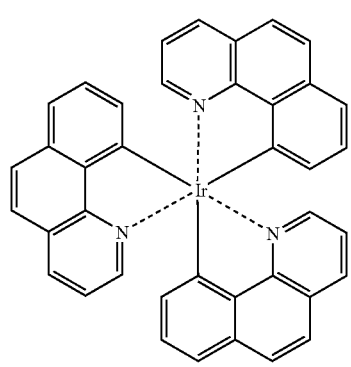
Ir-4 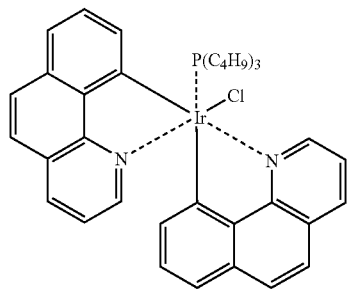
Ir-5 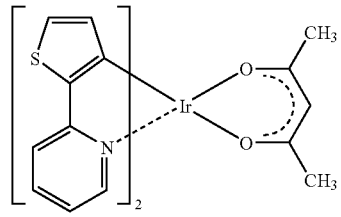
Ir-6 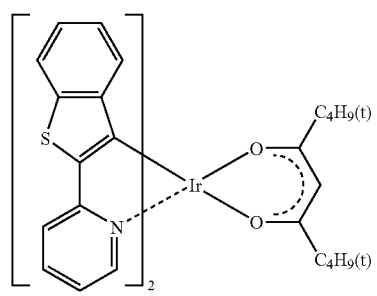
Ir-7 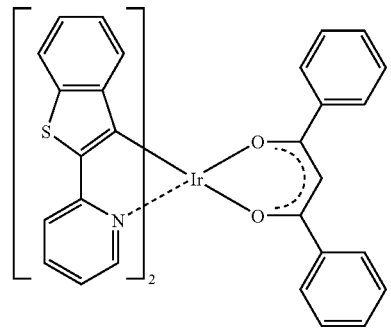
Ir-8 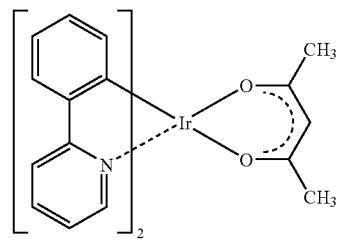
Ir-9 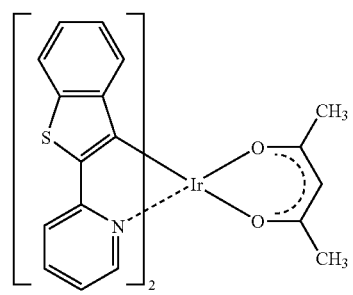
Ir-10 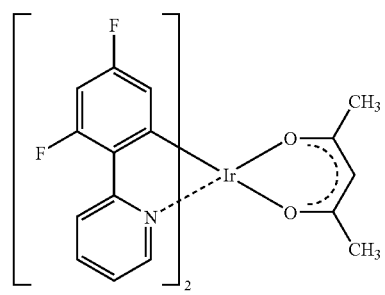
Ir-11 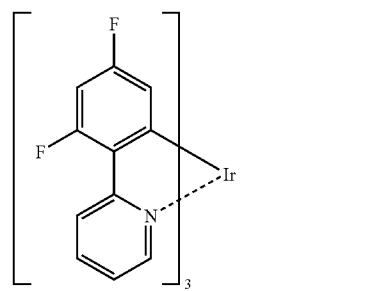

Ir-12
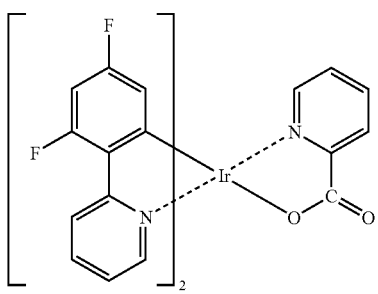
Ir-13
Pt-3
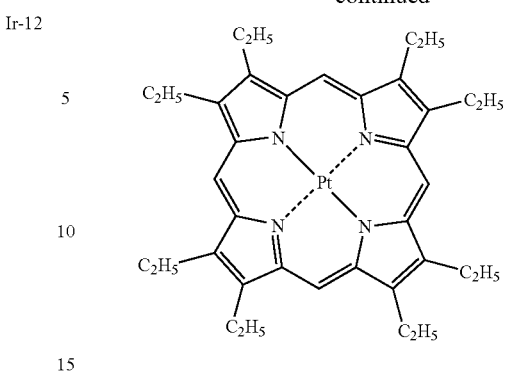
Os-1
Ir-14
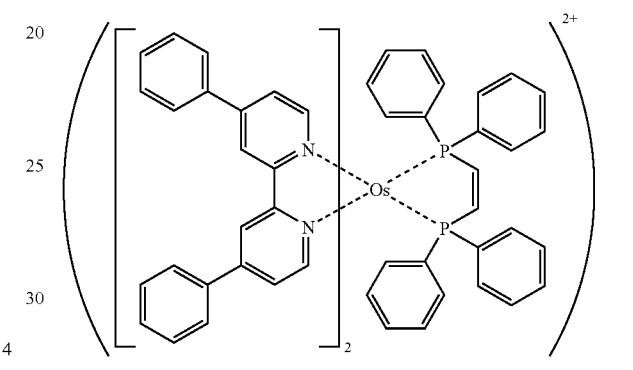
Pt-1
E-1
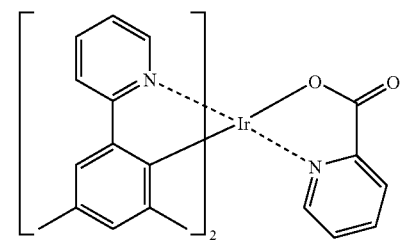
Pt-2
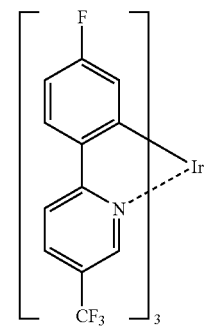
E-2
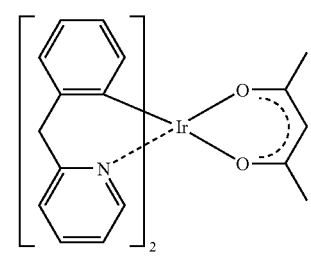
E-3

E-4
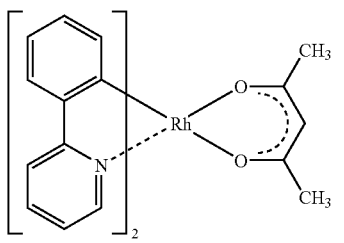
E-5
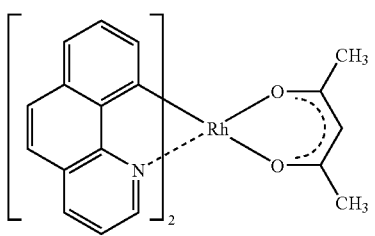
E-6
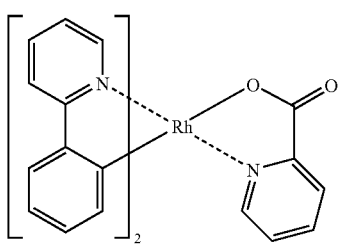
Pd-1
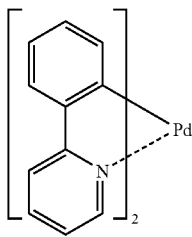
Pd-2
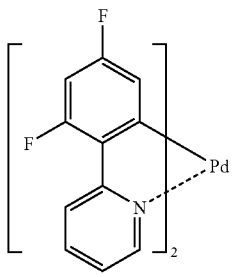
Pd-3
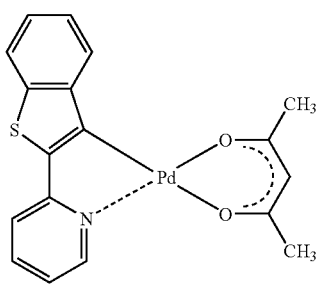
Rh-1
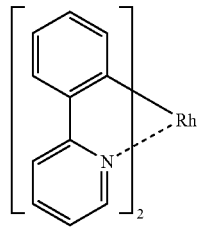
Rh-2
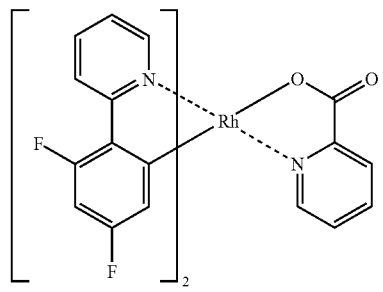
Rh-3
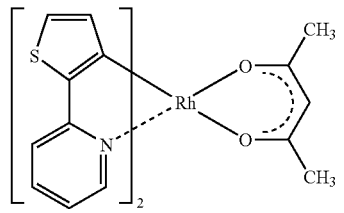
D-1
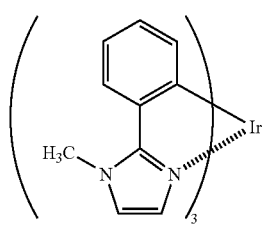
D-2
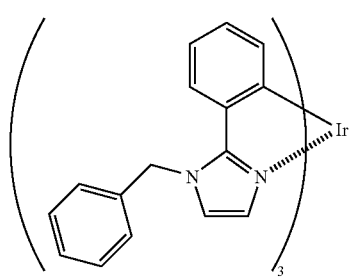
D-3
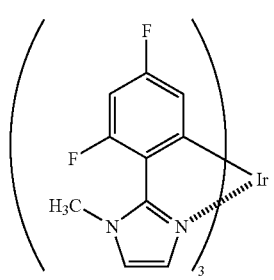
A fluorescent light emission material may be employed in the organic electroluminescence element of this invention.
A typical example of the former (a fluorescent dopant) includes coumarin type dye, pyran type dye, cyanine type dye, croconium type dye, squalium type dye, oxobenzanthracene type dye, fluorescein type dye, rhodamine type dye, pyrilium type dye, perylene type dye, stilbene type dye, polythiophene type dye or rare earth complex type fluorescent materials.

Known dopants may also be employed, examples thereof are listed;

WO 00/70655, JP-A 2002-280178, JP-A 2001-181616, JP-A 2002-280179, JP-A 2001-181617, JP-A 2002-280180, JP-A 2001-247859, JP-A 2002-299060, JP-A 2001-313178, JP-A 2002-302671, JP-A 2001-345183, JP-A 2002-324679, WO 02/15645, JP-A 2002-332291, JP-A 2002-50484, JP-A 2002-332292, JP-A 2002-83684, JP-A 2002-540572, JP-A 2002-117978, JP-A 2002-338588, JP-A 2002-170684, JP-A 2002-352960, WO 01/93642, JP-A 2002-50483, JP-A 2002-100476, JP-A 2002-173674, JP-A 2002-359082, JP-A 2002-175884, JP-A 2002-363552, JP-A 2002-184582, JP-A 2003-7469, JP-A 2002-525808, JP-A 2003-7471, JP-A 2002-525833, JP-A 2003-31366, JP-A 2002-226495, JP-A 2002-234894, JP-A 2002-235076, JP-A 2002-241751, JP-A 200-319779, JP-A 2001-319780, JP-A 2002-62824, JP-A 2002-100474, JP-A 2002-203679, JP-A 2002-343572, JP-A 2002-203678 and so on.

In the present invention, it is required that at least two types of emission dopants producing different emission colors are incorporated in a single emission layer; the content of all of the emission dopants is at least 5% by volume based on the emission layer; and of a plurality of the emission dopants, the content of an emission dopant emitting light of a main emission is at most 2% by volume based on the emission layer.

Further, the different emission colors mean that the maximum emission peak wavelengths of emission dopants differ. The difference in maximum emission peak wavelength between the both is preferably at least 30 nm.

An emission peak wavelength of the emission spectrum of each emission dopant can be determined from the emission spectrum of an organic electroluminescence element. The emission spectrum of an organic electroluminescence element includes a plurality of emission wavelength peaks, derived from the individual emission dopants, which are designated as the emission spectrum peaks of the individual emission dopants. Herein, spectroradiometer CS-1000 (produced by Konica Minolta Sensing, Inc.) was used for the determination.

The emission dopant emitting light of a main emission color incorporated in an emission layer is an emission dopant which takes a role of the maximum portion in the number ratio of photons generated from the emission layer. The emission dopant emitting light of a main emission color is preferably an emission dopant the photon number of which is at, least 60%; based on that of the emission layer.

The photon number derived from the main emission dopant can be verified as follows.

The emission spectrum of an emission layer is determined, and then in an emission spectrum separated for each of the emission spectra derived from the incorporated dopants, photon number $Iph(\lambda)$ can be determined by a formula described below based on emission intensity $Ie(\lambda)$ at wavelength $\lambda$. The sum total of $Iph(\lambda)$ in the entire emission spectrum range corresponds to the photon number of the dopant. The ratio of the photon number of the dopant to the total photon number, which is the sum total of photons determined for all of the dopants, refers to the photon number ratio.

$$Iph(\lambda)=Ie(\lambda)\times\lambda/(1.987\times10^{-16})$$

Incidentally, the emission spectrum derived from each dopant is one obtained by determining the emission spectrum of an element incorporating no dopants except one to be determined. Herewith, emission spectrum separation for each dopant in an emission layer incorporating at least two types of dopants can be carried out.

Further, the HOMO level (highest occupied molecular orbital) of an emission dopant featuring an emission peak wavelength of a short wave (an emission color is of a short wave) is preferably higher than that of an emission dopant featuring an emission peak wavelength of a long wave (an emission color is of a long wave).

A HOMO value can be determined via calculation or measurement. In cases of calculation, the value is one calculated employing Gaussian98 (Gaussian98, Revision A. 11.4, M. J. Frisch, at al., Gaussian, Inc., Pittsburg Pa., 2002.) which is a molecular orbital calculation software produced by Gaussian, Inc. in the U.S.A., being defined as a value obtained by rounding off, to one decimal place, a value (a converted value in the unit of eV) calculated via structural optimization employing B3LYP/6-31G* as a key word. The background where this calculated value is effective is because there is a high correlation between a calculated value obtained employing this method and an experimental one.

In cases of measurement, a method of conducting direct determination via photoelectron spectroscopy is used. Specifically, employed is a value determined using low-energy photoelectron spectroscopy instrument "Model AC-1" (produced by Riken Keiki Co., Ltd.).

<<Intermediate Layer>>

A non-light emitting intermediate layer (also referred to as a non-doped region) will now be described.

When there is a plurality of emission layers, the non-light emitting intermediate layer is a layer provided between the emission layers.

The film thickness of the non-light emitting layer is preferably in the range of 1-20 nm, more preferably in the range of 3-10 nm from the viewpoint of preventing interaction such as energy transfer between adjacent emission layers as well as of not applying a large load to the current and voltage characteristics of an element.

A material used for this non-light emitting layer either is, or is not, identical with a host compound of an emission layer, however, being preferably identical with a host material of at least either of two adjacent emission layers.

The non-light emitting intermediate layer may incorporate a compound common to a non-emission layer and each emission layer (for example, a host compound). When a common host material is incorporated in each thereof (herein, employment of a common host material indicates cases in which the physicochemical characteristics such as the phosphorescence emission energy or the glass transition point are each identical or the molecular structure of each host compound is identical), an interlayer injection barrier between an emission layer and a non-emission layer is reduced and then there can be realized an effect that the injection balance between positive holes and electrons is easily maintained even with a varied voltage (current). Further, when a host material featuring physicochemical characteristics or a molecular structure identical with those of a host compound incorporated in each emission layer is used in a non-doped emission layer, cumbersome procedures in preparation of an element which are major problems in conventional preparation of an organic EL element can be solved at the same time.

In the organic EL element of the present invention, since a host material plays a role of transporting carriers, a material exhibiting carrier transporting ability is preferable. Carrier mobility is employed as a physical property indicating the carrier transporting ability. It is observed that the carrier mobility of an organic material commonly depends on the electric field intensity. Since a material highly dependent on the electric field intensity tends to loose the balance of injection/transport of positive holes and electrons, a material less dependent on the electric field intensity is preferably used as an intermediate layer material or host material.

Further, on the other hand, in order to optimally control the injection balance of positive holes and electrons, it is also exemplified as a preferred embodiment that a non-light emitting intermediate layer functions as an inhibition layer, that is, a positive hole inhibition layer or an electron inhibition layer, to be described later.

<<Injection Layer: Electron Injection Layer, Positive Hole Injection Layer>>

An injection layer is provided when it is necessary and includes an electron injection layer and a positive hole injection layer, which may be arranged between an anode and an emission layer or a positive transport layer, and between a cathode and an emission layer or an electron transport layer, as described above.

An injection layer is a layer which is arranged between an electrode and an organic layer to decrease an driving voltage and to improve an emission luminance, which is detailed in volume 2, chapter 22 Electrode Materials" (pp. 123-166) of "Organic EL Elements and Industrialization Front thereof (Nov. 30, 1998, published by N. T. S. Inc.)", and includes a positive hole injection layer (an anode buffer layer) and an electron injection layer (a cathode buffer layer).

An anode buffer layer (a positive hole injection layer) is also detailed in such as JP-A H09-45479, JP-A H09-260062 and JP-A H08-288069, and concrete examples include such as a phthalocyanine buffer layer represented by such as copper phthalocyanine, an oxide buffer layer represented by such as vanadium oxide, an amorphous carbon buffer layer, and a polymer buffer layer employing conductive polymer such as polyaniline (emeraldine) and polythiophene.

A cathode buffer layer (an electron injection layer) is also detailed in such as JP-A H06-325871, JP-A H09-17574 and JP-A H10-74586, and concrete examples include a metal buffer layer represented by strontium, aluminum and so on, an alkali metal compound buffer layer represented by lithium fluoride, an alkali metal earth compound buffer layer represented by magnesium fluoride and an oxide buffer layer represented by aluminum oxide. The above-described buffer layer (injection layer) is preferably a very thin layer, and the layer thickness is preferably in a range of 0.1 nm-5 μm although it depends on a raw material.

<Inhibition Layer: Positive Hole Inhibition Layer, Electron Inhibition Layer>

An inhibition layer is provided in addition to an elemental layer arrangement of the organic compound layer as described above. There is, for example, a positive inhibition (hole block) layer described in such as JP-A H11-204258 and JP-A H11-204359 and p. 273 of "Organic EL Elements and Industrialization Front Thereof (Nov. 30 (1998), published by NTS. Inc.)".

A positive hole inhibition layer, in a broad meaning, is provided with a function of electron transport layer, being comprised of a material having a function of transporting an electron but a very small ability of transporting a positive hole, and can improve the recombination probability of an electron and a positive hole by inhibiting a positive hole while transporting an electron. Further, an arrangement of an electron transport layer described later can be appropriately utilized as a positive hole inhibition layer according to this invention.

The positive hole inhibition layer of the organic EL element of this invention is preferably provided adjacent to an emission layer.

On the other hand, an electron inhibition layer is, in a broad meaning, provided with a function of a positive hole transport layer, being comprised of a material having a function of transporting a positive hole but a very small ability of transporting an electron, and can improve the recombination probability of an electron and a positive hole by inhibiting an electron while transporting a positive hole. Further, an arrangement of a positive hole transport layer described later can be appropriately utilized as an electron inhibition layer. Thickness of the positive hole inhibition layer and electron transport layer is preferably 3-100 nm, and more preferably 5-30 nm.

<Positive Hole Transport Layer>

A positive hole transport layer is composed of a material having a function of transporting a positive hole, and a positive hole injection layer and an electron inhibition layer are also included in a positive hole transport layer in a broad meaning. A single layer of or plural layers of a positive hole transport layer may be provided.

A positive hole transport material is those having any one of a property to inject or transport a positive hole or a barrier property to an electron, and may be either an organic material or an inorganic material. For example, listed are a triazole derivative, an oxadiazole derivative, an imidazole derivative, a polyarylalkane derivative, a pyrazoline derivative, a pyrazolone derivative, a phenylenediamine derivative, a arylamine derivative, an amino substituted chalcone derivative, an oxazole derivatives, a styrylanthracene derivative, a fluorenone derivative, a hydrazone derivative, a stilbene derivative, a silazane derivative, an aniline type copolymer, or electro-conductive high molecular oligomer, particularly preferably such as thiophene oligomer.

As a positive hole transport material, those described above can be utilized, however, it is preferable to utilize a porphyrin compound, an aromatic tertiary amine compound and a styrylamine compound, and specifically preferably an aromatic tertiary amine compound.

Typical examples of an aromatic tertiary amine compound and a styrylamine compound include N,N,N',N'-tetraphenyl-4,4'-diaminophenyl; N,N'-diphenyl-N,N'-bis(3-methylphenyl)-(1,1'-biphenyl)-4,4'-diamine (TDP); 2,2-bis(4-di-p-tolylaminophenyl)propane; 1,1-bis(4-di-p-tolylaminophenyl)cyclohexane; N,N,N',N'-tetra-p-tolyl-4,4'-diaminobiphenyl; 1,1-bis(4-di-p-tolylaminophenyl)-4-phenylcyclohexane; bis(4-dimethylamino-2-methylphenyl) phenylmethane; bis(4-di-p-tolylaminophenyl) phenylmethane; N,N'-diphenyl-N,N'-di(4-methoxyphenyl)-4,4'-diaminobiphenyl; N,N,N',N'-tetraphenyl-4,4'-diaminodiphenylether; 4,4'-bis(diphenylamino) quadriphenyl; N,N,N-tri(p-tolyl)amine; 4-(di-p-tolylamino)-4'-[4-(di-p-tolylamino)styryl]stilbene; 4-N,N-diphenylamino-(2-diphenylvinyl)benzene; 3-methoxy-4'-N,N-diphenylaminostilbene; and N-phenylcarbazole, in addition thereto, those having two condensed aromatic rings in a molecule described in U.S. Pat. No. 5,061,569, such as 4,4'-bis[N-(1-naphthyl)-N-phenylamino]biphenyl (NPD), and 4,4',4"-tris[N-(3-methylphenyl)-N-phenylamino]triphenylamine (MTDATA), in which three of triphenylamine units are bonded in a star burst form, described in JP-A H04-308688.

A polymer in which the material mentioned above is introduced in the polymer chain or a polymer having the material as the polymer main chain can be also used. As the hole injecting material or the hole transporting material, inorganic compounds such as p-type Si and p-type SiC are usable.

A so-called p-type hole blocking layer as disclosed in JP-A No. 11-251067 or described in the literature of J. Huang at al. (Applied Physics Letters 80 (2002), p. 139) is also applicable. In the present invention, these materials are preferably utilized since an emitting element exhibiting a higher efficiency is obtained.

This positive hole transport layer can be provided by forming a thin layer made of the above-described positive hole transport material according to a method known in the art such as a vacuum evaporation method, a spin coating method, a cast method, an inkjet method and a LB method. The layer thickness of a positive hole transport layer is not specifically limited, however, is generally 5 nm ~5 µm, and preferably 5-200 nm. This positive transport layer may have a single layer structure comprised of one or two or more types of the above described materials.

A positive hole transport layer having high p-type property doped with impurity can be utilized. Example thereof includes those described in JP-A-H04-297076, JP-A-2000-196140, JP-A-2001-102175, and J. Appl. Phys., 95, 5773 (2004) and so on.

It is preferable to employ such a positive hole transport layer having high p-type property, since an element with lower power consumption can be prepared in this invention.

<Electron Transport Layer>

An electron transport layer is composed of a material having a function of transporting an electron, and an electron transport layer and a positive hole inhibition layer are also included in a positive hole transport layer in a broad meaning. A single layer of or plural layers of an electron transport layer may be provided.

The electron transport material (it works as a positive hole inhibition layer, simultaneously), which is employed in a single electron transport layer and an electron transport layer provided adjacent to cathode side with respect to emission layer when it is used as plural layers, is sufficient to have a function to transmit an electron injected from a cathode to an emission layer, and compounds conventionally known in the art can be utilized by arbitrarily selection as a material thereof. Examples of a material include such as a nitro-substituted fluorene derivative, a diphenylquinone derivative, a thiopyrandioxide derivative, carbodiimide, a fleorenylidenemethane derivative, anthraquinonedimethane and anthrone derivatives, and an oxadiazole derivative. Further, a thiazole derivative in which an oxygen atom in the oxadiazole ring of the above-described oxadiazole derivative is substituted by a sulfur atom, and a quinoxaline derivative having a quinoxaline ring which is known as an electron attracting group can be utilized as an electron transport material. Polymer materials, in which these materials are introduced in a polymer chain or these materials form the main chain of polymer, can be also utilized.

Further, a metal complex of a 8-quinolinol derivative such as tris(8-quinolinol)aluminum (Alq), tris(5,7-dichloro-8-quinolinol)aluminum, tris(5,7-dibromo-8-quinolinol) aluminum, tris(2-methyl-8-quinolinol)aluminum, tris(5-methyl-8-quinolinol)aluminum and bis(8-quinolinol)zinc (Znq); and metal complexes in which a central metal of the aforesaid metal complexes is substituted by In, Mg, Cu, Ca, Sn, Ga or Pb, can be also utilized as an electron transport material. Further, metal-free or metal phthalocyanine, or those the terminal of which is substituted by an alkyl group and a sulfonic acid group, can be preferably utilized as an electron transport material. Further, distyrylpyrazine derivative, which has been exemplified as a material of an emission layer, can be also utilized as an electron transport material, and, similarly to the case of a positive hole injection layer and a positive hole transport layer, an inorganic semiconductor such as an n-type-Si and an n-type-SiC can be also utilized as an electron transport material.

This electron transport layer can be provided by forming a thin layer made of the above-described electron transport material according to a method known in the art such as a vacuum evaporation method, a spin coating method, a cast method, a printing method including an inkjet method, and a LB method. The layer thickness of an electron transport layer is not specifically limited; however, is generally 5 nm-5 µm, preferably 5-200 nm. This electron transport layer may have a single layer structure comprised of one or not less than two types of the above described materials.

An electron transport layer having high p-type property doped with impurity can be utilized. Example thereof includes those described in JP-A-H04-297076, JP-A-H10-270172, JP-A-2000-196140, JP-A-2001-102175, and J. Appl. Phys., 95, 5773 (2004) and so on.

It is preferable to employ such an electron transport layer having high p-type property, since an element with lower power consumption can be prepared in this invention.

<Substrate>

A substrate (also referred to as a base body, a base plate, a base material or a support) according to an organic EL element of this invention is not specifically limited with respect to types of such as glass and plastics being transparent or opaque, however, a transparent substrate preferably utilized includes such as glass, quartz and transparent resin film. A specifically preferable substrate is resin film capable of providing an organic EL element with a flexible property.

Resin film includes polyester such as polyethylene terephthalate (PET) and polyethylene naphthalate (PEN), polyethylene, polypropylene, cellophane, cellulose ester and its derivatives such as cellulose diacetate, cellulose triacetate, cellulose acetate butylate, cellulose acetate propionate (CAP), cellulose acetate phthalate (TAC), and cellulose nitrate, polyvinylidene chloride, polyvinylalcohol, polyethylenevinylalcohol, syndiotactic polystyrene, polycarbonate, norbornane resin, polymethylpentene, polyetherketone, polyimide, polyether sulfone (PES), polyphenylene sulfide, polysulfones, polyether imide, polyetherketone imide, polyamide, fluorine resin, nylon, polymethyl methacrylate, acryl or polyarylates, cyclo-olefin resin such as ARTON (commercial name, manufactured by JSR Corp.) or APEL (commercial name, manufactured by Mitsui Chemicals Inc.).

On the surface of resin film, an inorganic or organic cover layer or a hybrid cover layer comprising the both may be formed, and the film is preferably provided with a high barrier ability having a vapor permeability of not more than 0.01 g/m$^2$·day·atm measured by a method stipulated by JIS K 7129-1992, and more preferably a high barrier ability having an oxygen permeability of not more than $10^{-3}$ g/m$^2$·day·atm as well as a vapor permeability of not more than $10^{-3}$ g/m$^2$·day, and further preferably both the vapor permeability and oxygen permeability of not more than $10^{-5}$ g/m$^2$·day·atm, measured by a method stipulated by JIS K 7126-1992.

Any materials capable of preventing penetration of substance causing degradation of the element such as moisture and oxygen are usable for forming the barrier layer. For example, silicon oxide, silicon dioxide and silicon nitride are usable. It is more preferable to give a multi-laminated layer structure composed of such the inorganic layer and a layer of an organic material to the barrier layer for improving the fragility of the layer. It is preferable that the both kinds of layers are alternatively laminated for several times though there is no limitation as to the laminating order of the inorganic layer and the organic layer.

<<Barrier Layer Forming Method>>

The method for forming the barrier layer is not specifically limited and, for example, a vacuum deposition method, spattering method, reaction spattering method, molecule beam epitaxy method, cluster-ion beam method, ion plating method, plasma polymerization method, atmosphere pressure plasma polymerization method, plasma CVD method, laser CVD method, heat CVD method and coating method are applicable, and the atmosphere pressure plasma polymerization method such as that described in JP A 2004-68143 is particularly preferable.

As the opaque substrate, for example, a plate of metal such as aluminum and stainless steel, a film or plate of opaque resin and a ceramic substrate are cited.

<<Sealing>>

As the sealing means, a method for pasting together with a sealing material, the electrodes and the substrate by an adhesive agent is applicable.

The sealing material is placed so as to cover the displaying area of the organic EL element and may have a flat plate shape or a concave plate shape, and the transparence and the electric insulation property of it are not specifically limited.

Concretely, a glass plate, polymer plate, polymer film, metal plate and metal film can be cited. As the glass plate, a plate of soda-lime glass, barium strontium-containing glass, lead glass, alumino silicate glass, boron silicate glass and quartz are usable. As the polymer plate, a plate of polycarbonate, acryl resin, polyethylene terephthalate, polyether sulfide and polysulfone are usable. As the metal plate, a plate composed of one or more kinds of metal selected from stainless steel, iron, copper, aluminum, magnesium, nickel, zinc, chromium, titanium, molybdenum, silicon, germanium and tantalum and an alloy of them are cited.

The polymer film and the metal film are preferably used by which the element can be made thinner in the invention.

The polymer film having an oxygen permeability of not more than $10^{-3}$ g/m$^2$/day and a steam permeability of not more than $10^{-3}$/m$^2$/day is preferred. It is more preferable that the oxygen permeability and the steam permeability are each not more than $10^{-5}$/m$^2$/day, respectively.

For making the sealing material into the concave shape, a sandblast treatment and a chemical etching treatment are applicable. As the adhesive agent, a photo-curable and thereto-curable adhesive agents containing a reactive vinyl group of acryl type oligomer and a methacryl type oligomer, and a moisture curable adhesive agent such as 2-cyanoacrylate can be cited. Epoxy type thermally and chemically (two liquid type) curable adhesive agents are applicable. Hot-melt type polyamide, polyester and polyolefin adhesive agents are applicable. Cationic curable type UV curable epoxy adhesive agent is also usable.

The organic EL element is degraded by heat in some cases, therefore, the adhesive agent capable of being cured to adhere within the temperature range of from room temperature to 80° C. is preferred. A moisture absorbing agent may be dispersed in the adhesive agent. Coating of the adhesive agent onto the adhering portion may be performed by a dispenser available on the market or printing by a screen printing.

It is preferable that an inorganic or organic layer is provided on outside of the electrode placed on the side of facing to the substrate through an organic layer so as to cover the electrode and the organic layer and contact with the substrate to form a sealing layer. In such the case, the material for forming the sealing layer may be a material having a function to inhibit permeation of a substance causing degradation such as water and oxygen, and silicon oxide, silicon dioxide and silicon nitride are usable for example. The layer preferably has a multi-laminated layer structure composed of an inorganic material and an organic material. As the method for forming such a layer, a vacuum deposition method, spattering method, reaction spattering method, molecule beam epitaxy method, cluster-ion beam method, ion plating method, plasma polymerization method, atmosphere pressure plasma polymerization method, plasma CVD method, laser CVD method, heat CVD method and coating method are applicable.

In the space between the sealing material and the displaying portion of the organic EL element, an inactive gas such as nitrogen and argon or carbon fluoro hydride or an inactive liquid such as silicone oil is preferably injected in gas or liquid phase. The space may be made vacuum. A hygroscopic compound may be enclosed inside.

Examples of the hygroscopic compound include a metal oxide such as sodium oxide, potassium oxide, calcium oxide, barium oxide, magnesium oxide and aluminum oxide; a sulfate such as sodium sulfate, calcium sulfate, magnesium sulfate and cobalt sulfate; a metal halide such as calcium chloride, magnesium chloride, cesium fluoride, tantalum fluoride, cerium bromide, magnesium bromide, barium iodide and magnesium iodide; and a perchlorate such as barium perchlorate and magnesium perchlorate. Anhydrate is preferable as to the sulfate, halide and perchlorate.

<<Protection Layer and Protection Plate>>

A protection layer or a protection plate may be provided on outside of the sealing layer of the side facing to the substrate through the organic layer or the outside of the sealing film for raising the mechanical strength of the element. Such the protection layer or plate is preferably provided since the strength of the element is not always so high in case that the sealing is carried out by the foregoing sealing layer. The glass plate, polymer plate, polymer film and plate, and metal film and plate the same as those to be used for sealing are usable for such the protection material. Polymer film is preferably used from the viewpoint of light weight and thin layer forming.

<Anode>

As an anode according to an organic EL element of this invention, those comprising metal, alloy, a conductive compound, which has a large work function (not less than 4 eV), and a mixture thereof as an electrode substance are preferably utilized. Specific examples of such an electrode substance include an electro-conductive transparent material such as metal like Au, CuI, indium tin oxide (ITO), SnO$_2$ and ZnO. Further, a material such as IDIXO (In$_2$O$_3$—ZnO), which can prepare an amorphous and transparent electrode, may be also utilized. As for an anode, these electrode substances may be made into a thin layer by a method such as evaporation or spattering and a pattern of a desired form may be formed by means of photolithography, or in the case of requirement of pattern precision is not so severe (not less than 100 μm), a pattern may be formed through a mask of a desired form at the time of evaporation or spattering of the above-described substance. When emission is taken out of this anode, the transmittance is preferably set to not less than 10% and the sheet resistance as an anode is preferably not more than a several hundreds Ω/□. Further, although the layer thickness depends on a material, it is generally selected in a range of 10-1,000 nm and preferably of 10-200 nm.

<Cathode>

Metal, alloy, a conductive compound and a mixture thereof, which have a small work function (not more than 4 eV), are utilized as an electrode substance as a cathode according to this invention, on the other hand. Specific examples of such an electrode substance includes such as sodium, sodium-potassium alloy, magnesium, lithium, a magnesium/copper mixture, a magnesium/silver mixture, a magnesium/aluminum mixture, a magnesium/indium mixture, an aluminum/aluminum oxide ($Al_2O_3$) mixture, indium, a lithium/aluminum mixture and rare earth metal.

Among them, with respect to an electron injection property and durability against such as oxidation, preferable are a mixture of electron injecting metal with the second metal which is stable metal having a work function larger than electron injecting metal, such as a magnesium/silver mixture, a magnesium/aluminum mixture, a magnesium/indium mixture, an aluminum/aluminum oxide ($Al_2O_3$) mixture and a lithium/aluminum mixture, and aluminum. A cathode can be provided by a method such as evaporation or spattering to form a thin layer. Further, the sheet resistance as a cathode is preferably not more than a several hundreds $\Omega/\square$ and the layer thickness is generally selected in a range of 10 nm-5 μm and preferably of 50-200 nm. Herein, to transmit emission, either one of an anode or a cathode of an organic EL element is preferably transparent or translucent to improve the emission luminance.

A transparent or translucent cathode may be prepared by a method in which the above mentioned metal is provided on the anode with a thickness of 1-20 nm and then electroconductive transparent material described as the anode. An element having both transparent anode and cathode may be prepared by applying this method.

<Preparation Method of Organic EL Element>

As an example of a preparation method of an organic EL element of this invention, a preparation method of an organic EL element, comprising anode/positive hole injection layer/positive hole transport layer/emission layer/positive hole inhibition layer/electron transport layer/cathode, will be described.

First, on an appropriate substrate, a thin layer comprising a desired electrode substance such as an anode electrode substance is formed by means of evaporation or spattering so as to make a layer thickness of not more than 1 μm and preferably of 10-200 nm, whereby an anode is prepared. Next, thin layers of organic materials such as a positive hole injection layer, a positive hole transport layer, an emission layer, a positive hole inhibition layer and an electron transport layer are formed on this layer.

A thin layer forming method of these layers containing the organic compound includes such as an evaporation method and a wet process (a spin coat method, a cast method, an inkjet method, and a printing method) as described before, however, a vacuum evaporation method, a spin coat method, inkjet method, or a printing method is specifically preferable with respect to easy preparation of a homogeneous layer and bare generation of pinholes. Further, a different layer forming method depending on each layer may be applied. In the case of employing an evaporation method in layer formation, the evaporation condition depends on such as the type of a utilized compound, however, is generally appropriately selected in a range of 50-450° C. as a boat heating temperature, $10^{-6}$-$10^{-2}$ Pa as a vacuum degree, 0.01-50 nm/sec as a deposition rate, −50-300° C. as a substrate temperature and 1 nm-5 μm, preferably 5-200 nm as a layer thickness.

After formation of these layers, a thin layer comprising a cathode electrode substance is formed thereon by means of such as evaporation or spattering so as to make a layer thickness of not more than 1 μm, preferably in a range of 50-200 nm to provide a cathode, whereby a desired organic EL element can be prepared. This preparation of an organic EL element is preferably carried out with one time evacuation to prepare all through from a positive hole injection layer to a cathode, however, different layer forming method may be also applied by taking out the element on the way. Consideration is necessary such that the operation be performed under a dry inert gas environment in this instance.

Further, reversing the preparation order, it is also possible to prepare layers in the order of a cathode, an electron transport layer, a positive hole inhibition layer, an emission layer, a positive hole transport layer and an anode. When a direct current voltage is applied on the multicolor display device thus prepared, emission can be observed by application of a voltage of approximately 2-40 V setting an anode to + (plus) polarity and a cathode to − (minus) polarity. Further, alternate current voltage may be applied. The wave shape of alternate current may be arbitrary.

Generally it is said that, in the organic EL element, light is emitted in a layer of which refractive index is higher (the refractive index is about 1.6 to 2.1) than that of air, and only 15 to 20% of the light emitted in the light emission layer can be taken out. This is because the light which enters into the interface (interface of a transparent substrate and air) with the angle θ larger than a critical angle cannot be taken out of the element due to the total internal reflection, or because the light is totally reflected between the transparent substrate and the transparent electrode or between the transparent substrate and the light emission layer, resulting in being wave-guided in the transparent electrode or in the light emission layer to get away to the side of the element.

Examples of a method to improve the efficiency of taking out of the light include: a method to form concavity and convexity on the surface of the transparent substrate to prevent total internal reflection at the interface between the transparent substrate and air (for example, U.S. Pat. No. 4,774,435); a method to provide a light converging function to the substrate (for example, JP-A S63-314795); a method to provide a reflecting surface on the side of the element (for example, JP-A No H01-220394); a method to provide a flat layer between the substrate and the light emission layer, the flat layer having an intermediate refractive index to form an anti-reflection layer (for example, refer to JP-A S62-172691); a method to provide a flat layer having a low refractive index between the substrate and the light emission layer (for example, JP-A 2001-202827); and a method to provide a diffraction grating between any of the substrate, transparent electrode and light emission layer (including the interlayer between the substrate and out side air) (for example JP-A H11-283751).

In the present invention, these methods can be used in combination with the organic electroluminescence element of the present invention. Also, a method of forming a flat layer having a lower refractive index than that of the substrate between the substrate and the light emission layer, or a method of forming a diffraction grating between any of the substrate, transparent electrode and light emission layer (including the interlayer between the substrate and out side air) can be preferably used. In the present invention, by combining these methods, an element exhibiting further higher luminance and durability can be obtained.

When a low refractive index medium having a thickness larger than the wavelength of the light is formed between the transparent electrode and the transparent substrate, the light-extracting efficiency of light which comes out of the transparent electrode increases with decreasing refractive index.

As a low refractive index layer, aerogel, porous silica, magnesium fluoride and fluorine-containing polymer, are cited, for example. Since the refractive index of the transparent substrate is generally 1.5 to 1.7, the refractive index of the low refractive index layer is preferably 1.5 or less and more preferably 1.35 or less.

The thickness of a low refractive index medium is preferably more than twice of the wavelength of the light in the medium, because when the thickness of the low refractive index medium, where the electromagnetic wave exuded as an evanescent wave enters into the transparent substrate, and the effect of the low refractive index layer is reduced.

The method to provide a diffraction grating at the interface where the total internal reflection occurs or in some of the medium has a feature that the effect of enhancing the light-extracting efficiency is high. The intension of this method is to take out the light which cannot come out due to such as total internal reflection between the layers among the light emitted in the light emission layer, by providing a diffraction grating between any of the layers or in any of the mediums (in the transparent substrate or in the transparent electrode), using the property of the diffraction grating that it can change the direction of light to a specified direction different from the direction of reflection due to so-called Bragg diffraction such as primary diffraction or secondary diffraction.

The diffraction grating to be provided preferably has a two-dimensional periodic refractive index. This is because, since the light is emitted randomly to any direction, only the light proceeds to a specific direction can be diffracted when a generally used one-dimensional diffraction grating having a periodic refractive index only in a specific direction is used, whereby the light-extracting efficiency is not largely increases. However, by using diffraction grating having a two-dimensionally periodic refractive index, the light proceeds any direction can be diffracted, whereby the light-take out efficiency is increased.

The diffraction grating may be provided between any of the layers on in any of the mediums (in the transparent substrate or in the transparent electrode), however, it is preferably provided in the vicinity of the organic light emission layer where the light is emitted.

The period of the diffraction grating is preferably about ½ to 3 times of the wavelength of the light in the medium. The array of the diffraction grating is preferably two-dimensionally repeated, for example, as in the shape of a square lattice, a triangular lattice, or a honeycomb lattice.

In the organic electroluminescence element of the present invention, the luminance in the specified direction, for example, the front direction against the emitting plane of the element can be increased, for example, by processing to form a structure of a micro-lens array or in combination with a so-called light-condensing sheet on the light-extracting side surface of the substrate.

As an example of a micro-lens array, quadrangular pyramids 30 μm on a side and having a vertex angle of 90° are two-dimensionally arranged on the light extracting side surface of the substrate. The side of the quadrangular pyramids is preferably 10-100 μm. When the length of the side is shorter than the above range, the light is colored due to the effect of diffraction, and when it is longer than the above range, it becomes unfavorably thick.

As a light-condensing sheet, the one practically applied for an LED backlight of a liquid crystal display is applicable. Examples of such a sheet include a brightness enhancing film (BEF) produced by SUMITOMO 3M Inc. As the shape of the prism, triangle-shaped strip having a vertex angle of 90° and a pitch of 50 μm, the one having round apexes, or the one having a randomly changed pitch may be included.

In order to control the luminous radiation angle of the light emitting element, a light diffusion plate and a film may be used in combination with the light-condensing sheet. For example, a diffusion film (light-up) produced by KIMOTO Co., Ltd. can be used.

<<Use>>

The organic EL element of the invention can be used as a displaying device, display, and various kinds of light source. As the light source, domestic illumination, car interior illumination, backlight of watches or liquid crystal displays, sign boards, signals, light source of photo memories, light source of electrophotographic copying machine, light source of light communication processor and light source of light sensors though the use is not limited to the above. Particularly, the device is suitably used in combination with a color filter as the backlight of the liquid crystal display or the light source of illumination.

When the device combined with a color filter is used as the backlight of the display, the device is preferably used in combination with a light collection sheet for further raising illuminance.

EXAMPLES

The present invention will now be described with reference to the following example that by no means limits the scope of the present invention.

Example

<<Preparation of Organic EL Element No. 1>>

A support substrate was prepared by depositing ITO (indium tin oxide) at a thickness of 120 nm on a 30 mm×30 mm glass substrate of a thickness of 0.7 mm as an anode, followed by patterning. Then, a transparent support substrate having this ITO transparent electrode was cleaned with isopropyl alcohol via ultrasonic waves, and dried using dry nitrogen, followed by being subjected to UV ozone cleaning for 5 minutes. This transparent support substrate was fixed onto a substrate holder in a common vacuum deposition apparatus available on the market.

Each of the deposition crucibles in the vacuum deposition apparatus was individually filled with constituent materials of each layer. As the deposition crucibles, those made of a molybdenum- or tungsten-made resistance heating material were used.

Subsequently, depressurization was carried out down to a vacuum degree of $4\times10^{-4}$ Pa. Then, the deposition crucibles containing m-MTDATA were heated by applying current, followed by deposition on the transparent support substrate at a deposition rate of 0.1 nm/second to provide a positive hole injection layer of 20 nm thereon. Further, a positive hole transport layer of 40 nm was provided by depositing α-NPD in the same manner. Thereafter, the deposition crucibles filled with each material were applied with current to form each emission layer, each intermediate layer, and a positive hole inhibition layer via codeposition or single deposition so as to form each of the layers at the corresponding mixture ratio as described in Table 1. Then, an electron transport layer was provided via codeposition with a 3:1 mixture ratio of BCP and CsF at 40 nm at a deposition rate of 0.1 nm/second.

Further, a cathode was formed by depositing aluminum at 110 nm to prepare Organic EL Element No. 1.

<<Preparation of Organic EL Element Nos. 2-6>>

Organic EL Element Nos. 2-6 were prepared in the same manner as for Organic EL Element No. 1 except that the constituent materials, the mixture ratio, and the film thickness of each layer were changed as shown in Table 1.

Incidentally, when plural materials are used for each layer, the mixture ratio described in Table 1 refer to a volume ratio (% by volume).

TABLE 1

| Organic EL Element No. | Emission Layer 1 <Thickness> | Intermediate layer <Thickness> | Emission Layer 2 <Thickness> | Intermediate layer <Thickness> | Emission Layer 3 <Thickness> | Positive hole inhibition layer <Thickness> | Remarks |
|---|---|---|---|---|---|---|---|
| 1 | Ir-1: 5%, Host: Compound (1) 95%, <2 nm> | Compound (1), <3 nm> | Ir-14: 7%, Host: Compound (1) 93%, <3 nm> | Compound (3), <3 nm> | Ir-12; 6%, Host: Compound (1) 94%, <10 nm> | Compound (2), <3 nm> | Comp. |
| 2 | Ir-1: 2%, Host: Compound (1) 98%, <2 nm> | Compound (1) <3 nm> | Ir-14: 1.5%, Host: Compound (1) 98.5%, <3 nm> | Compound (3), <3 nm> | Ir-12: 2%, Host: Compound (1) 98%, <10 nm> | Compound (2), <3 nm> | Comp. |
| 3 | Ir-1: 5%, Host: Compound (1) 95%, <2 nm> | Compound (3), <3 nm> | D-1: 6% Ir-14: 0.8% Host: Compound (3) 93.2%, <1.5 nm> | — | D-1: 6% Host: Compound (3) 94%, <11 nm> | Compound (2), <3 nm> | Inv. |
| 4 | Ir-1: 1.5%, D-1: 6% Host: Compound (1) 92.5%, <2 nm> | Compound (3), <3 nm> | Ir-14: 7%, Host: Compound (1) 93%, <2.5 nm> | — | D-1: 6% Host: Compound (3) 94%, <11 nm> | Compound (2), <3 nm> | Inv. |
| 5 | Ir-1: 5%, Host: Compound (1) 95%, <2 nm> | Compound (3), <3 nm> | Ir-14: 6% Ir-12: 0.8%, Host: Compound (1) 93.2%, <2.5 nm> | Compound (3), <3 nm> | Ir-14: 6%, Host: Compound (3) 94%, <11 nm> | Compound (2), <3 nm> | Inv. |
| 6 | Ir-12: 1.5% D-1: 6% Host: Compound (1) 92.5%, <2 nm> | Compound (3), <3 nm> | Ir-14: 7% Host: Compound (1) 93%, <2.5 nm> | — | Ir-1: 5%, Host: Compound (3) 95%, <11 nm> | Compound (2), <3 nm> | Inv. |

Comp.: Comparative,
Inv.: Inventive

Incidentally, the structures of the above compounds used are listed below.

m-MTDATA a-NPD

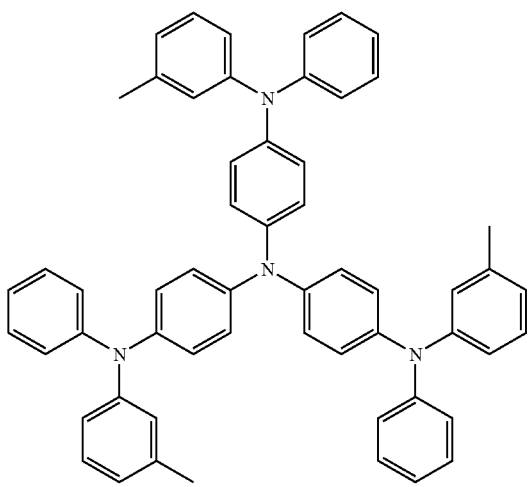

BCP

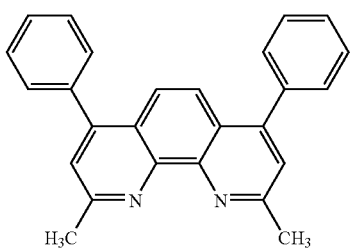

Compound (1)

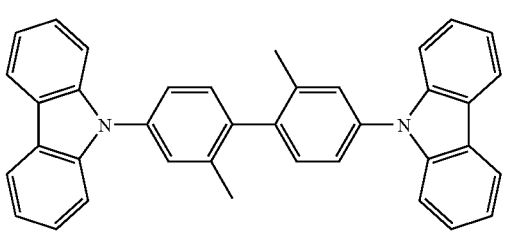

Compound (2)

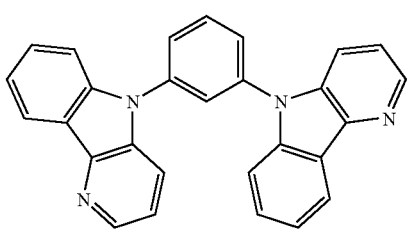

Compound (3)

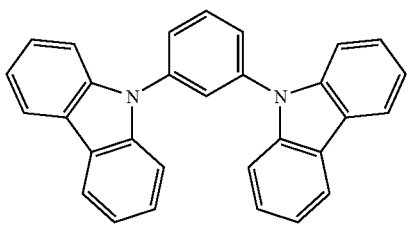

<<Evaluation of Power Efficiency of Organic EL Element>>

Figure 2:
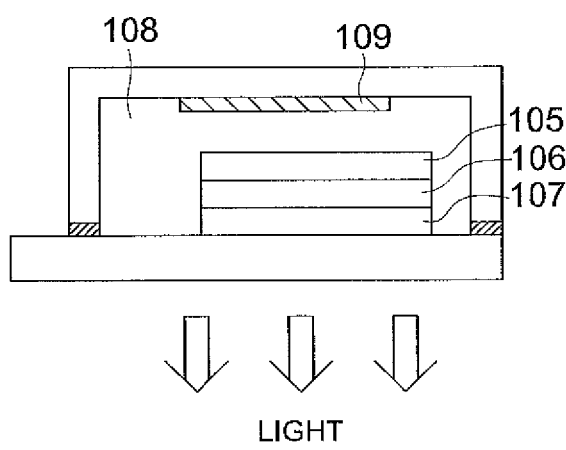
FIG. 2 shows a cross section of the illuminating device of the invention.

The non-light emitting side of each of Organic EL Element Nos. 1-6 was covered with a glass case (herein, sealing operation using the glass case was conducted in a glove box under a nitrogen ambience (under an ambience of high purity nitrogen gas of a purity of at least 99.999%) with no contact of Organic EL Element with the air) to prepare an illumination device as shown in FIGS. 1 and 2, and then the power efficiency and the emission spectrum of each of Organic EL Elements was evaluated using spectral radiation luminance meter CS-1000 (produced by Konica Minolta Sensing, Inc.). The evaluation results are listed in Table 2. The power efficiencies in Table 2 are shown as relative values when the power efficiency of Organic El Element No. 1 is designated as 100.

Herein, emission luminance is one obtained via determination of front luminance at a 2° viewing angle.

TABLE 2

| Organic EL Element No. | Power efficiency | Emission spectrum peak wavelength (nm) | Remarks |
| --- | --- | --- | --- |
| 1 | 100 | 477/513/622 | Comparative |
| 2 | 85 | 477/513/622 | Comparative |
| 3 | 115 | 470/513/622 | Inventive |
| 4 | 108 | 470/513/622 | Inventive |
| 5 | 105 | 477/513/622 | Inventive |
| 6 | 104 | 477/513/622 | Inventive |

Organic EL Element Nos. 3-6 exhibited excellent power efficiency compared to Organic EL Element Nos. 1 and 2.

The emission spectrum peak wavelength and the HOMO level of each emission dopant are listed in Table 3.

The HOMO value is one obtained via calculation employing Gaussian98 (Gaussian98, Revision A.11.4, M. J. Frisch, et al, Gaussian, Inc., Pittsburg Pa., 2002.) which is a molecular orbital calculation software produced by Gaussian, Inc. in the U.S.A., being a value (eV) calculated via structural optimization employing B3LYP/6-31G* as a key word and then rounded off to one decimal place.

Further, the emission spectrum peak wavelength of the emission dopant can be determined from the emission spectrum of Organic EL Element. Herein, for the determination, spectroradiometer CS-1000 (produced by Konica Minolta Sensing, Inc.) was used.

TABLE 3

| Emission dopant | Emission spectrum peak wavelength (nm) | HOMO level (eV) |
| --- | --- | --- |
| Ir-1 | 513 | 5.5 |
| Ir-14 | 622 | 5.1 |
| D-1 | 470 | 5.0 |
| Ir-12 | 477 | 6.0 |

The invention claimed is:

1. An organic electroluminescence element emitting white light, comprising:
light emission layers consisting of:
a blue light emission layer;
a green light emission layer;
a red light emission layer;
wherein at least one emission layer of the green light emission layer and the red light emission layer, contains two or more emission dopants producing different emission colors;
a content of all of the two or more emission dopants in the at least one emission layer is 5% or more by volume based on a volume of the at least one emission layer;
one emission dopant of the two or more emission dopants in the at least one emission layer, emits light of a main emission color among all of the two or more emission dopants, and the emission dopant emitting light of a main emission color is an emission dopant that has a photon number which is at least 60% based on the total photon number for all the dopants in the at least one emission layer;
a content of the one emission dopant emitting light of a main emission color in the at least one emission layer is not more than 2% by volume based on a volume of the at least one emission layer; and
a peak wavelength of an emission spectrum of the one emission dopant emitting light of a main emission color is longer than that of all of the other of the two or more emission dopants in the at least one emission layer.

2. The organic electroluminescence element of claim 1, wherein, HOMO level of an emission dopant having an emission spectrum of a shorter peak wavelength is higher than that of an emission dopant having an emission spectrum of a longer peak wavelength.

3. The organic electroluminescence element of claim 1, wherein a peak wavelength difference between emission spectra of the two or more emission dopants is more than 30 nm.

4. The organic electroluminescence element of claim 1, wherein at least one emission dopant emits phosphorescence.

5. The organic electroluminescence element of claim 1, wherein a thickness of each of blue, green and red light emission layer is from 1 to 20 nm.

6. The organic electroluminescence element of claim 5, wherein a total thickness of the blue, green, and red light emission layers is not more than 30 nm.

7. The organic electroluminescence element of claim 1, wherein the emission layers each emitting a color of blue, green, and red has an emission maximum wavelength of from 440 to 490 nm, 500 to 540 nm and 600 to 640 nm, respectively.

8. The organic electroluminescence element of claim 2, wherein each emission layer has an emission dopant emitting phosphorescence.

* * * * *